United States Patent [19]

Takezawa

[11] Patent Number: 4,829,385
[45] Date of Patent: May 9, 1989

[54] DATA COMMUNICATION APPARATUS

[75] Inventor: Katsuhito Takezawa, Tokyo, Japan

[73] Assignee: Canon Kabushiki Kaisha, Tokyo, Japan

[21] Appl. No.: 914,652

[22] Filed: Oct. 2, 1986

[30] Foreign Application Priority Data

Oct. 7, 1985 [JP] Japan .................. 60-222929

[51] Int. Cl.⁴ .............................................. H04M 1/40
[52] U.S. Cl. ...................................... 358/260; 358/280
[58] Field of Search ......................... 358/260, 263, 280

[56] References Cited
U.S. PATENT DOCUMENTS 4,447,829 5/1984 Schayes et al. .................... 358/260
4,463,386 7/1984 Goddard et al. .................... 358/261
4,553,171 11/1985 Holladay et al. ................... 358/263

FOREIGN PATENT DOCUMENTS

3229858 3/1983 Fed. Rep. of Germany.
3041502 9/1983 Fed. Rep. of Germany.

Primary Examiner—Edward L. Coles, Sr.
Attorney, Agent, or Firm—Fitzpatrick, Cella, Harper & Scinto

[57] ABSTRACT

A data communication apparatus transmits data in divided blocks, and attaches a particular code to an overlapping data block, thereby reducing the time required for transmission.

18 Claims, 6 Drawing Sheets

| A | B | C | D BLOCK DATA | E BLOCK DATA | |

DATA COMMUNICATION APPARATUS

BACKGROUND OF THE INVENTION

1. Field of the Invention

The present invention relates to a data communication apparatus.

2. Related Background Art

In conventional data communication apparatus, for example facsimile apparatus, the entire page of original document is scanned even when the same image appears twice or more, and the read data are transmitted in encoded form. Consequently, the amount of data increases and requires a long transmission time.

SUMMARY OF THE INVENTION

An object of the present invention is to provide an improvement on the data communication apparatus.

Another object of the present invention is to eliminate the above-explained drawbacks in the prior technology.

Still another object of the present invention is to provide a data communication apparatus capable of reducing the amount of data and also reducing the time required for transmission.

Still another object of the present invention is to divide the data into plural blocks and to utilize a preceding block for a block of a same content.

Still another object of the present invention is to automatically vary the size of data, in data divided into plural blocks, according to the size of block.

DETAILED DESCRIPTION OF THE PREFERRED EMBODIMENTS

Now the present invention will be clarified in detail by an embodiment shown in the attached drawings.

Figure 1:
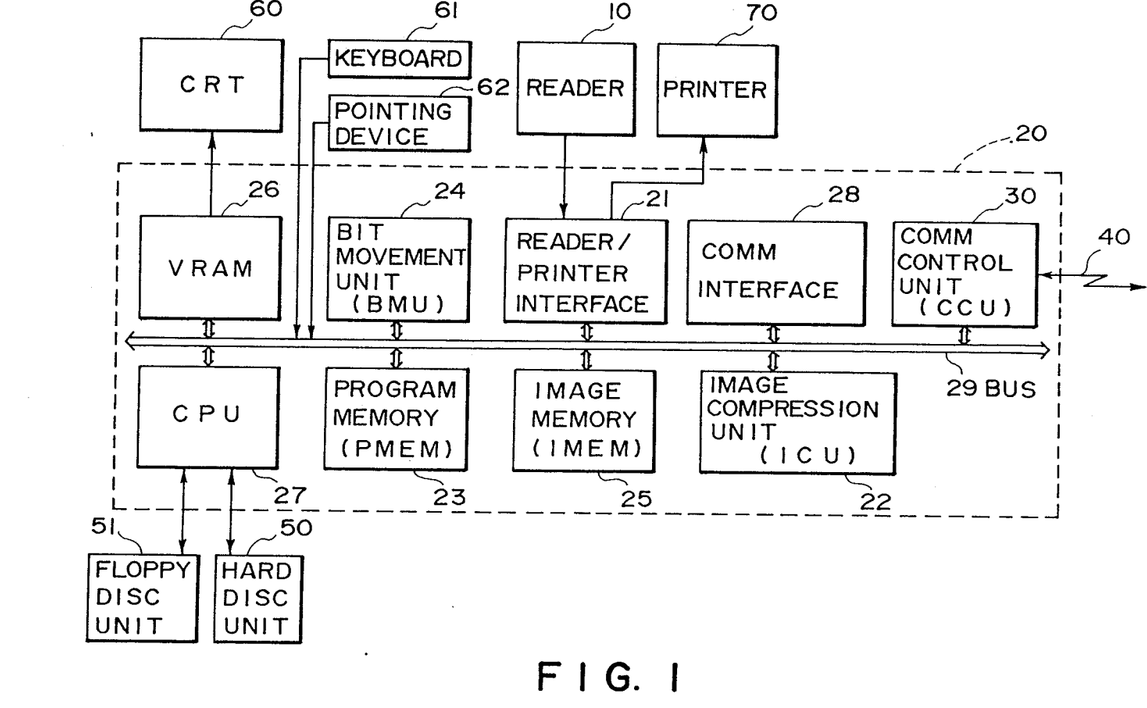
FIG. 1 is a block diagram of an embodiment of the present invention.
Figure 2:
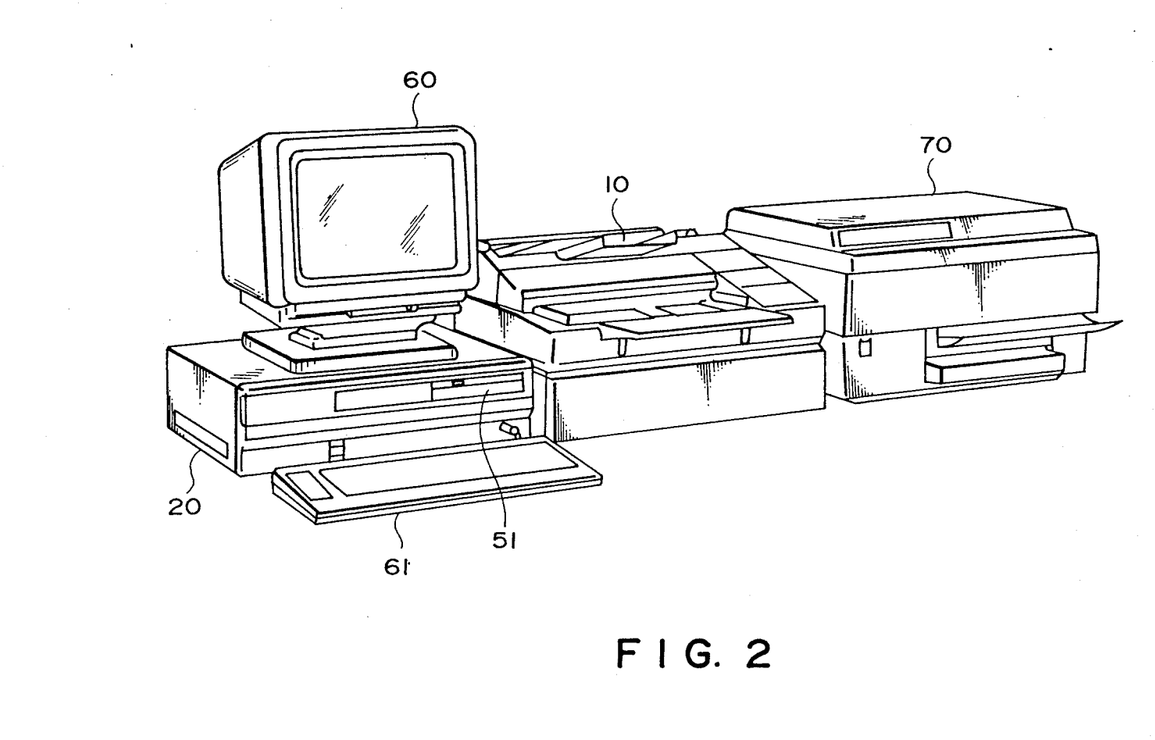
FIG. 2 is a perspective view of said embodiment.

FIG. 1 is a block diagram of an embodiment of the present invention, and FIG. 2 is a perspective view thereof.

A reader 10 is provided to generate an electrical signal by reading an original document.

A facsimile apparatus 20 is provided with read/-printer interface 21; an image compression unit (ICU) 22; a program memory (PMEM) 23; a bit movement unit (BMU) 24; an image memory (IMEM) 25; a video random access memory (VRAM) 26; a central processing unit (CPU) 27; a communication interface 28; a bus 29; and a communication control unit (CCU) 30.

The image compression unit (ICU) 22 is provided to compress or expand data, and employs two-dimensional compression or high grade compression to increasing coding efficiency. The program memory (PMEM) 23 is provided with a memory area for the operation system program and application program for controlling the various units in the facsimile apparatus 20 and input-/output devices annexed thereto, and a font memory area for converting character codes into image data.

The program memory (PMEM) 23 is provided with a memory management unit (MMEU) and a work area functioning as a buffer memory for the data transmitted from a rigid (or hard) disk through the CCU 30 or stored in said rigid disk through said CCU 30. Said buffer memory is used for speed matching of the rigid disk, the transmission channel, etc.

The bit movement unit (BMU) 24 is utilized for image editing or processing, including expansion, reduction, rotation, displacement or trimming of an image.

The image memory IMEM 25 has a capacity of 4 bytes and is used for storing the image from the reader, the image edited by the BMU 24, data expanded by the ICU 22, code data obtained by work processing, mixed data, or image data converted from character codes. In case of mixed data, image blocks and character blocks are stored with respective identification codes. The image memory (IMEM) 25 is also utilized for matching the speeds of the reader 10 and a communication channel 40 by temporarily storing necessary data. The video RAM 26 is used for storing image data to be displayed on a cathode ray tube device 60, in the form of bit map codes.

As external memories there are provided a rigid disk device 50 and a floppy disk device 51. These non-volatile memories can however be replaced by a backup memory as a non-volatile memory.

A keyboard 61 is used for entering characters and the like, and for designating a position on the cathode ray tube 60 with a cursor. There are also provided a pointing device 62 and a printer 70.

A mixed mode terminal of the present embodiment is capable of conducting communication of image data, character data, and mixed data in which image data and character data are mixed.

In the data transmission, an original to be transmitted is divided into plural blocks, for example of image areas and character areas. Image data or character data may be divided into plural blocks. Then each block is given code information indicating the position, size etc., and packet exchange is conducted in the block unit between the different communication apparatus.

Now reference is made to FIGS. 3A to 3D showing the data formats in the present embodiment.

Figure 3A:
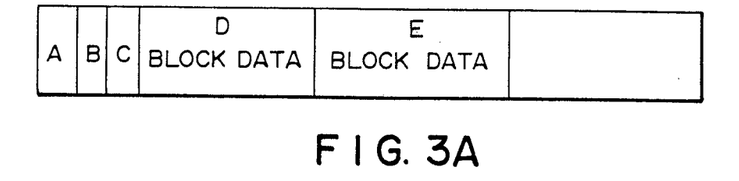
FIGS. 3A to 3D are charts showing data formats in said embodiment.

In FIG. 3A, A is transmission data indicating the name of source of communication, date of communication, number of pages of communication etc. B is page data, composed of an identification code indicating whether a page is composed of character data, image data or mixed data of characters and images, and a code indicating the number of blocks constituting the page.

C is a code indicating that data blocks are present thereafter.

D and E are data blocks.

The above-mentioned transmission data A, page data B and block indicating code C are attached by the transmitting apparatus.

Figure 3B:
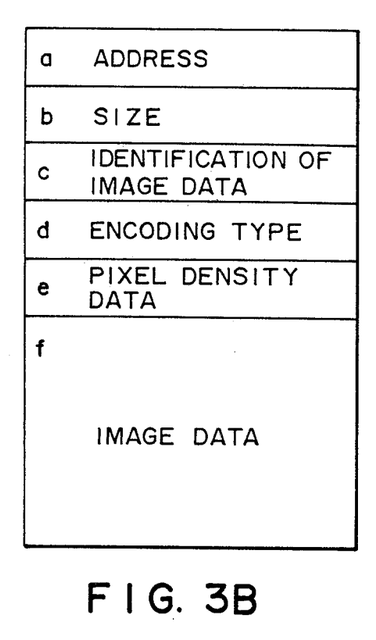

FIG. 3B shows data structure of a block of image data, wherein:

- a: address information of the block;
- b: size information of the block;
- c: information indicating that the block is composed of image data;
- d: information indicating the encoding method employed in said data block, for example MH, MR, MMR etc.;

e: information indicating the scanning density in the sub scanning direction of the image data; and f: image data.

Figure 3C:
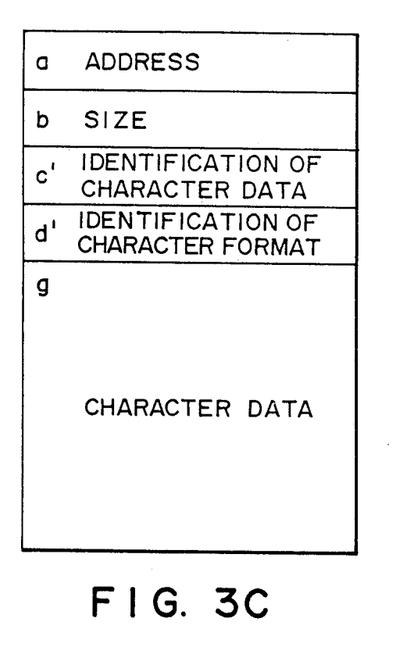

FIG. 3C shows data structure of a block composed of character data, wherein:

c': information indicating that the block is composed of character data; and d': information indicating the type of characters, such as size of characters, direction of arrangement of characters etc.

Figure 3D:
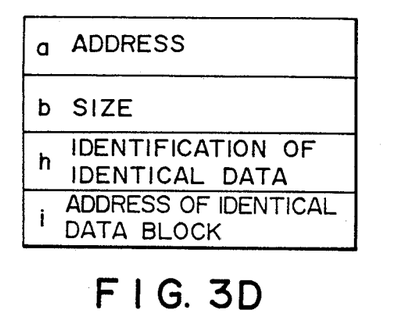

FIG. 3D shows data structure of a block which is identical with another block, wherein:

h: information indicating that data of said block is identical with those of another block; and i: address information of said another block.

In the following there will be explained the preparation of data shown in FIG. 3A.

The operator edits, on the image of a cathode ray tube 60, the image data read by the reader 10 and the character data entered by the keyboard 61.

The operator divides the original of a page, displayed on the cathode ray tube 60, into plural blocks, and address of size of each block are determined.

The operator enters the address and size of each block by the pointing device 62 and the keyboard 61, whereby the address information a and size information b, shown in FIGS. 3B, 3C and 3D, are attached to the character data and image data of the blocks.

The image data read by the reader 10 are encoded in the ICU 22 (MMR encoding in the present embodiment), and the information d indicating the encoding method and the information e indicating the scanning density of image data in the sub scanning direction are also attached.

On the other hand, the character data are given the formal information d'.

Also the character data or image data are respectively given the information c' indicating character data or information c indicating image data.

In case the data of a block are identical with those of another block, the operator enters the address of said another block, whereby attached are the information h indicating identical data, and the information i showing the address of the identical data block, as shown in FIG. 3D.

The above-mentioned additions of information are conducted by the CPU 27, and the original data of a page thus prepared are stored in the rigid disk device 50.

At the data transmission, the operator manipulates the keyboard 61 to cause the CPU 27 to read the data for transmission from the rigid disk 50. The transmission source data A and the page data B shown in FIG. 3A are entered from the keyboard 61 and attached to the data to be transmitted.

The transmission data shown in FIG. 3A are prepared in this manner and transmitted to a receiving apparatus through the CCU 30.

The reception of data is effected in the following manner.

The data received through a transmission channel 40 and the CCU 30 are stored in the rigid disk 50, and a message indicating the data reception is displayed on the cathode ray tube 60.

For displaying the received data on the cathode ray tube 60 or for printout by the printer 70, the operator designates the data and instructs the display or printout by the keyboard 61. In response the CPU 27 reads the designated original data from the rigid disk 50, and develop the data shown in FIG. 3A into dot data for storage in the image memory 25.

Figure 4:
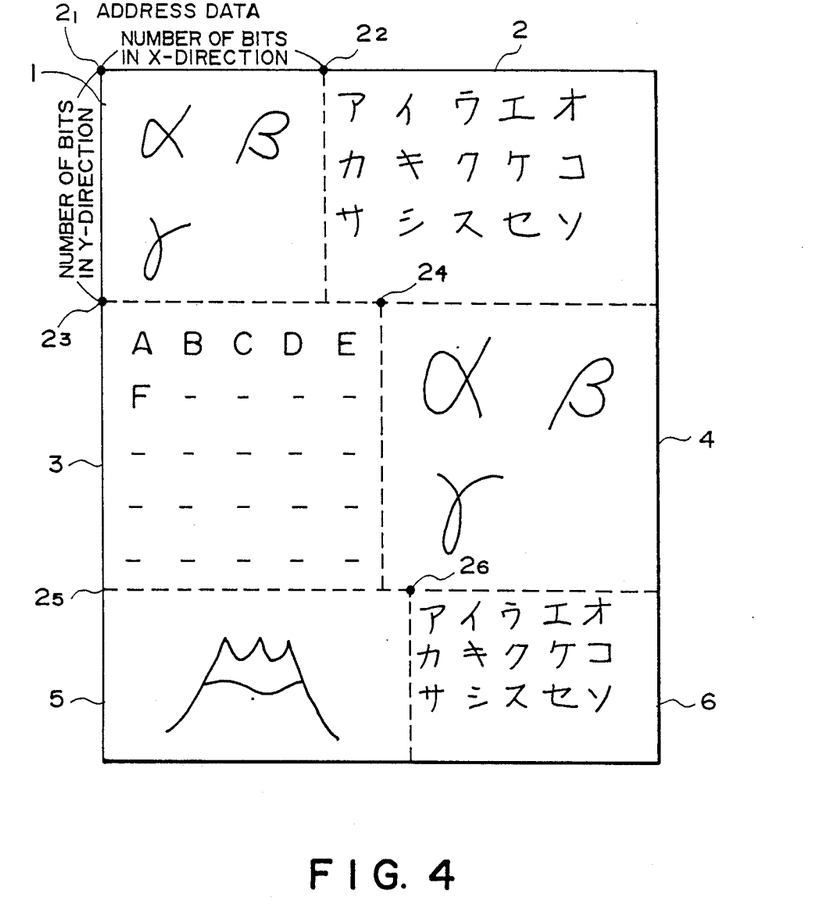
FIG. 4 is a view of a page memory of the image memory 25.

FIG. 4 shows dot data stored in a page memory of the image memory 25.

In the example illustrated in FIG. 4, a page is divided into six blocks. The source information code A attached to the data is developed into corresponding font data.

Subsequently the data block is expanded. At first the position and size of a block on the memory are determined from the address information a and the size information b, and dot data of the image data or character data are stored in the memory area corresponding to the block.

The CPU 27 discriminates, from the data identification information C or C' attached to the block, whether the data of said block are image data or character data. In case of image data, it causes the ICU 22 to decode the encoded image data according to the encoding information d and the density data e, and stores the dot data in the area for said block in the image memory 25. Also in case of character data, the characters are developed into dot data according to the format information d' and the font data stored in the program memory 23, and the obtained dot data are stored in the area for said block in the image memory 25.

In case the data of a block are those shown in FIG. 3D, the CPU 27 reads the image data or character data of an identical block indicated by the address i of same data block and stores the dot data of same image or character data block in said area of the image memory 25.

In the following there will be detailedly explained the reading of data block corresponding to a case shown in FIG. 3D.

After reading the data block of FIG. 3D from the rigid disk 50 (step S1 in FIG. 5), the CPU 27 determines a block area in the page memory of the image memory 25, according to the address information a and the size information b as explained before (steps S2 and S3 in FIG. 5). The size information b is composed of numbers of bits in the horizontal and vertical directions, and a block area is determined as shown in FIG. 4 by an address a, a number X of bits in the horizontal direction and a number Y of bits in the vertical direction.

Figures 5, 5A:
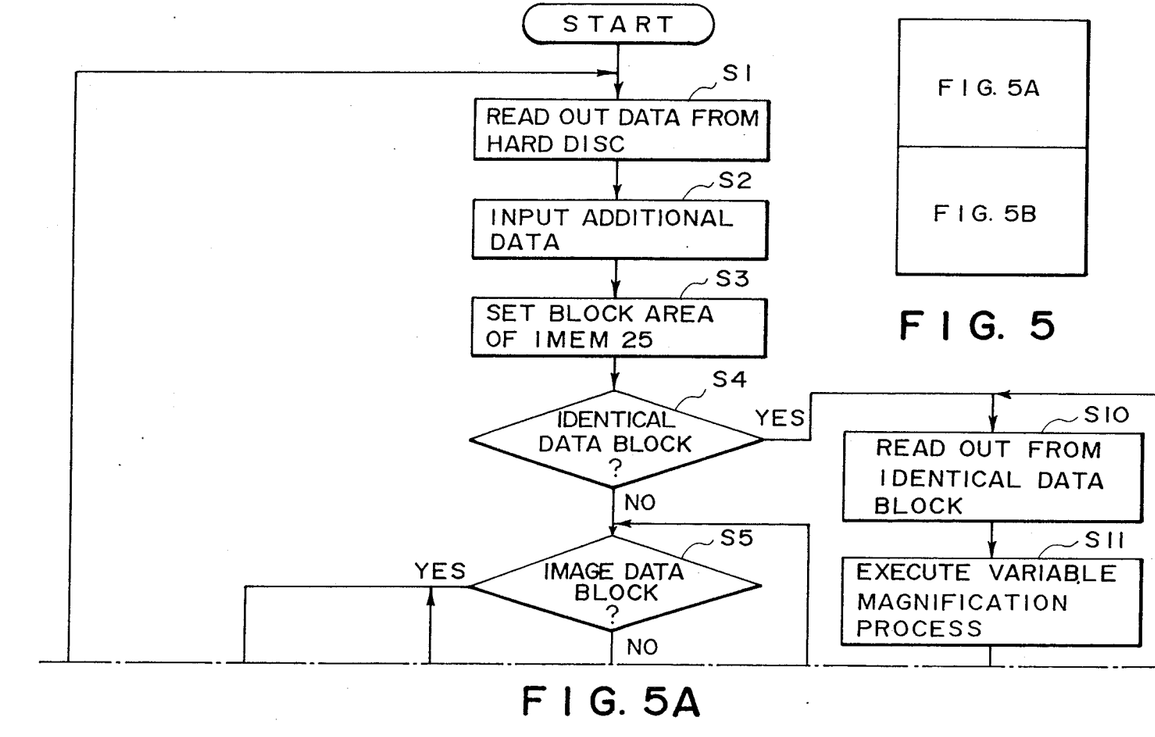
FIG. 5 composed of FIGS. 5A and 5B is a flow chart of data output in said embodiment.
Figure 5B:
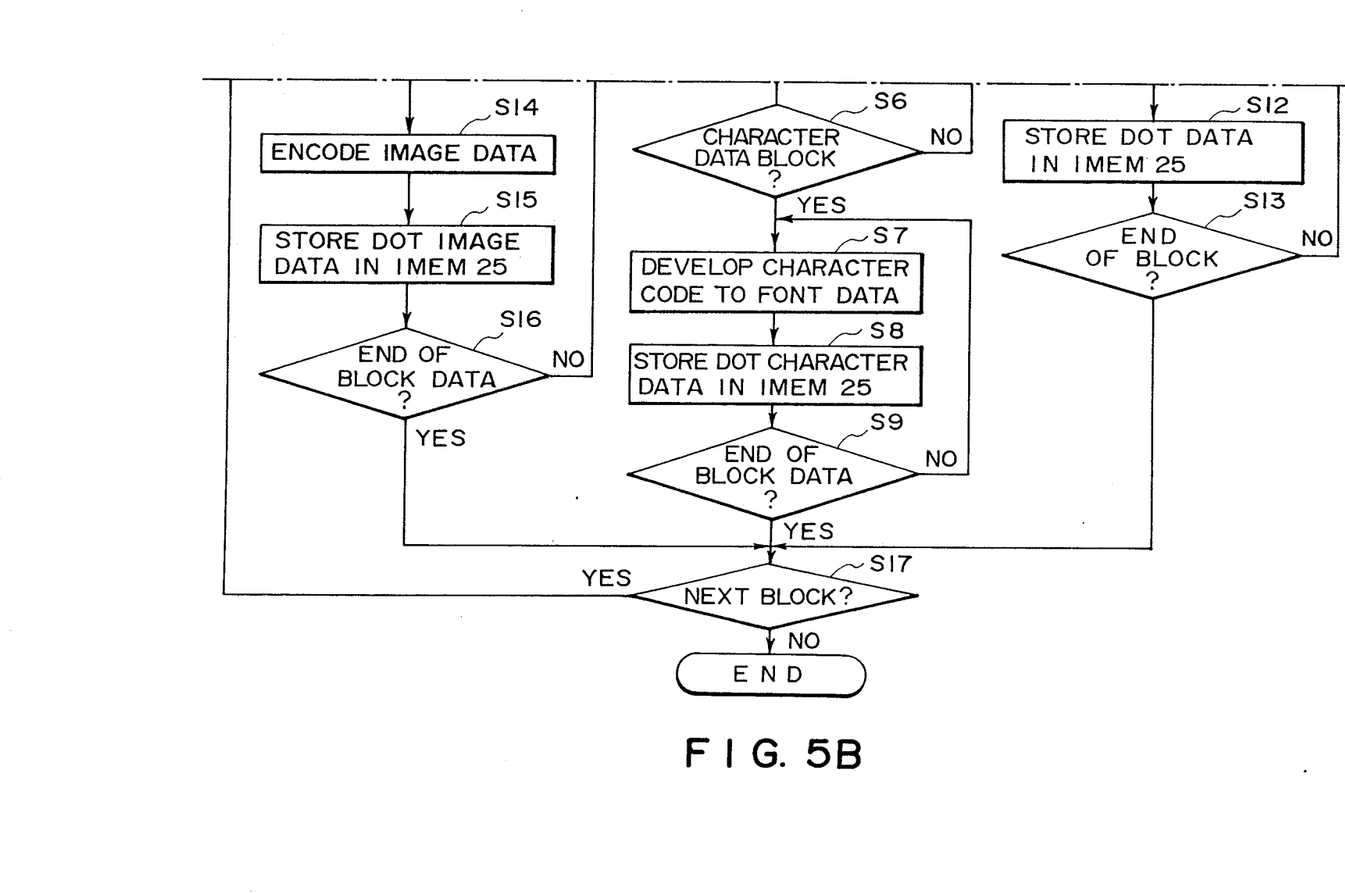

Then, upon identifying the information h indicating that the data of the block are identical with those of another block (step S4), the CPU 27 receives the information i indicating the address of said another identical block. Then, the CPU 27 reads the size information X', Y' of said identical block according to said address information i, and compares these values with the above-mentioned data X, Y. At the same time the CPU 27 discriminates whether the data of said identical block are image data or character data.

If said data are image data, the CPU 27 reads the dot data of an area of the image memory 25 for the identical block (step S10), then modifies the magnification of the dot image data thus read, according to the ratio of X, Y to X', Y' and stores said data in the block area of the image memory 25 (step S11). Modification in the magnification (or variable magnification) of the dot image data can be made in the usually utilized method.

In this manner identical image data are stored in the image memory 25.

For identical data, automatic size modification may be employed according to the size information.

Also when the data of identical data block are character data, the dot character data of said block are read from the image memory 25, then modified in size according to the size information b of the block and stored in a block area of the image memory 25, in the same manner as in the case of image data.

In case of character data, it is also possible to read the character data of the identical data block from the rigid disk 50 and to generate dot data from the font data of the program memory 23 according to the size information b of the block, and a cleaner image can be obtained in this manner, by direct dot generation anew from the font data.

In this manner the dot data as shown in FIG. 4 are stored in the page memory of the image memory 25.

In FIG. 4, a block 4 is obtained by modifying the size of a block 1, and a block 6 is obtained by modifying the size of the dot character data of a block 2. A block 3 is composed of dot character data, and a block 5 is composed of dot image data.

Data display on the cathode ray tube 60 is achieved by reading the display data from the image memory 25 and storing said data in the video RAM 26. Also data printout is achieved by reading the data from the image memory 25 and supplying said data to the printer 70.

For a block of which image or character data are identical with those of another block, the first-mentioned block only needs the address information i indicating the address of the latter block, and in this manner it is rendered possible to reduce the amount of information and the time required for transmission.

Also automatic size modification may be employed according to the size information b of the block as explained before.

In the foregoing description there have been utilized same image data or character data of another block in the same page, but it is also possible to utilize the image or character data of a block in another page, by adding page information to the address information i shown in FIG. 3D.

FIG. 5 is a flow chart of the present embodiment, according to which the mixed mode terminal of the present embodiment accomplishes the above-explained function.

In the following there will be given a more detailed explanation on the flow chart shown in FIG. 5.

At first a step S1 reads data block from the rigid disk 50, and a step S2 receives information attached to said data.

A step S3 determines a block area in the image memory 25, according to the address information and the size information for the block, contained in the attached information received in the step S2. Succeeding steps S4, S5 and S6 discriminate, according to said information, whether said block is an identical data block, an image data block or a character code block.

The program proceeds either to a step S10, or a step S14, or a step S7, respectively when an identical data block is identified in the step S4, or when an image data block is identified in the step S5, or when a character code block is identified in the step S6.

In case the step S6 identifies a character code block, the step S7 develops the character codes into predetermined font data according to the attached information, and a step S8 stores dot character data in the block area determined in the image memory 25. The steps S7, S8 and S9 are repeated until the step S9 identifies the end of the block data, and after said end, the program proceeds to a step S17.

In case the step S5 identifies an image data block, the step S14 decodes the encoded image data according to the attached information, and a step S15 stores the dot image data in the block area determined in the image memory 25. The steps S14, S15 and S16 are repeated until the step S16 identifies the end of the data block, and after said end, the program proceed to the step S17.

In case the step S4 identifies an identical data block, the step S10 reads, as the data of said block, the data of a block stored in the rigid disk 50, according to the address information of the attached information. A process similar to that in the step S7 or S14 is conducted respectively when said data are character code data or image data. Then a step S11 effects the size modification according to the size information of the block as explained before, then a step S12 stores the dot data in the block area determined in the image memory 25, and the program proceeds to a step S13. Then the steps S10, S11, S12 and S13 are repeated until the end of data block is identified in the step S13, and, after said end, the program proceeds to the step S17.

The step S17 discriminates the presence of succeeding data block, and, if present, the program returns to the step S1.

When the data of a page are read and the dot data of a page are stored in the image memory 25, the developed data are displayed on the cathode ray tube 60 or printed on the printer 70. Then the data of a succeeding page, if any, are read from the rigid disk 50 in the unit of block. The output of the original data is conducted by repeating the above-explained procedures.

As explained in the foregoing, the present invention allows to reduce the amount of data in the data communication apparatus, thus economizing the memory capacity and the data transmission time.

The present invention is applicable, not only to the mixed mode terminal in the foregoing embodiment but also to any data communication apparatus such as telex, teletex or videotex.

Also the present invention is not limited to the foregoing embodiment but is subject to various modifications and variations within the scope and spirit of the appended claims.

I claim:

1. A data communication apparatus comprising:
setting means for dividing data into a plurality of blocks, each of said blocks having an independent size, and for setting for each of said blocks information representing the size thereof;
assigning means, when the contents of at least one of said blocks is identical to the contents of a previous one of said blocks, herein referred to as an identical block, for assigning a particular code to replace the contents of said identical block to indicate that said identical block is identical to said previous block; and
transmission means for transmitting said plurality of blocks of the data, wherein said particular code reduces the amount of the data transmitted by said transmission means.

2. A data communication apparatus according to claim 1, wherein the data transmitted by said data transmission means comprises image data and character code data, and each of said image data and character code data is transmitted in said plurality of said blocks.

3. A data communication apparatus according to claim 1, wherein said particular code includes information indicating which one of said blocks is said previous block.

4. A data communication apparatus according to claim 1, wherein the data to be transmitted is at least one page of data divided into said blocks.

5. A data communication apparatus comprising:
reception means for receiving data divided into a plurality of blocks, each of said plurality of blocks being provided with size information representing the size thereof, and
reproduction means including means for determining whether said received blocks are assigned a particular code, for reproducing the contents in said received blocks in accordance with the size information and when said received blocks are assigned said particular code reproducing the contents in accordance with said particular code, wherein said particular code indicates that when the contents of one of said plurality of blocks (herein referred to as an identical block) are assigned said particular code, the contents of said identical block is identical to the contents of another of said plurality of blocks (herein referred to as an original block), and wherein said reproduction means reproduces the contents of said original block into the contents of said identical block.

6. A data communication apparatus according to claim 5, wherein the data received by said reception means comprises image data and character code data and each of the image data and character code data is received in said plurality of blocks.

7. A data communication apparatus according to claim 5, wherein said reproduction means reproduces the data in said original block with magnification change in accordance with the size information of said identical block assigned the particular code.

8. A data communication apparatus according to claim 5, wherein the received data is at least one page of data divided into said plurality of blocks.

9. A data communication process comprising the steps of:
dividing data to be transmitted into a plurality of blocks and setting for each of said plurality of blocks size information representing the size thereof;
assigning the contents, when at least one of said blocks is identical to the contents of a previous one of said blocks, herein referred to as an identical block, a particular code to replace the contents of said indentical block and to indicate that said identical block is identical to said previous block;
transmitting the data in said plurality of blocks;
receiving the transmitting data; and
reproducing the received data in accordance with the size information sent in said plurality of blocks, wherein said process further comprises the step of determining whether said received blocks are assigned said particular code, and when the contents of one of said received blocks (herein referred to as an identical received block), are assigned said particular code, the contents of said identical received block is identical to the contents of another received block, herein referred to as an original received block.

10. A data communication process according to claim 9, wherein the contents of said original received block is reproduced in the contents of said identical received block.

11. A data communication process according to claim 9, wherein the contents of said plurality of blocks are modified in size and reproduced according to said size information.

12. A data communication process according to claim 11, wherein the transmitted data comprises character code data and image data each of which is divided into said plurality of blocks.

13. A data communication process according to claim 9, wherein the data is at least one page of data divided into said plurality of blocks.

14. A data processing apparatus comprising:
processing means for dividing data into a plurality of blocks;
setting means for setting for each of said plurality of blocks size information representing the size thereof; and
conversion means for automatically converting said data divided into said plurality of blocks in accordance with the size information.

15. A data processing apparatus according to claim 14, wherein said conversion means changes the data divided into said plurality of blocks in size in accordance with the size information.

16. A data processing apparatus according to claim 14, wherein said processing means reproduces the data divided into the plurality of blocks in accordance with the size information set for each of said plurality blocks.

17. A data communication apparatus according to claim 14, wherein the data is at least one page of data divided into said plurality of blocks.

18. A data communication apparatus according to claim 14, wherein the data is a mixture of character code data and image data and each of the character code data and image data is divided into said plurality of blocks.

* * * * *

UNITED STATES PATENT AND TRADEMARK OFFICE
CERTIFICATE OF CORRECTION

PATENT NO.  : 4,829,385
DATED       : May 9, 1989
INVENTOR(S) : KATSUHITO TAKEZAWA

Page 1 of 2

It is certified that error appears in the above-identified patent and that said Letters Patent is hereby corrected as shown below:

Title page:

IN [56] REFERENCES CITED

FOREIGN PATENT DOCUMENTS, "3041502  9/1983  Fed. Rep. of Germany." should read --3041502  5/1981  Fed. Rep. of Germany.--

COLUMN 1

Line 64, "increasing" should read --increase--.

COLUMN 2

Line 42, "size" should read --size,--.

COLUMN 3

Line 2, "sub scanning" should read --subscanning--.
Line 23, "of size" should read --and size--.
Line 33, "sub scanning" should read --subscanning--.

COLUMN 4

Line 2, "develop" should read --develops--.

COLUMN 6

Line 9, "proceed" should read --proceeds--.
Line 54, "blocks is" should read --blocks, herein referred to as an identical block, is--.
Line 55, "herein referred to as an identical" should be deleted.
Line 56, "block," should be deleted.

UNITED STATES PATENT AND TRADEMARK OFFICE
CERTIFICATE OF CORRECTION

PATENT NO. : 4,829,385
DATED : May 9, 1989
INVENTOR(S) : KATSUHITO TAKEZAWA

It is certified that error appears in the above-identified patent and that said Letters Patent is hereby corrected as shown below:

COLUMN 7

Line 50, "blocks is" should read --blocks, herein referred to as an identical block, is--.
Line 51, "herein referred to as an identical" should be deleted.
Line 52, "block," should be deleted.

COLUMN 8

Line 2, "transmitting data;" should read --transmitted data;--.
Line 45, "plurality blocks." should read --plurality of blocks.--.

Signed and Sealed this

Sixth Day of March, 1990

Attest:

JEFFREY M. SAMUELS

*Attesting Officer*         *Acting Commissioner of Patents and Trademarks*